United States Patent
Kawada et al.

(10) Patent No.: US 7,754,095 B2
(45) Date of Patent: Jul. 13, 2010

(54) PIEZOELECTRIC CERAMIC COMPOSITION AND PIEZOELECTRIC CERAMIC ELECTRONIC COMPONENT

(75) Inventors: Shinichiro Kawada, Shiga-ken (JP); Ryoko Katayama, Shiga-ken (JP); Katsuhiro Horikawa, Shiga-ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 251 days.

(21) Appl. No.: 11/517,484

(22) Filed: Sep. 8, 2006

(65) Prior Publication Data
US 2007/0001553 A1 Jan. 4, 2007

Related U.S. Application Data

(63) Continuation of application No. PCT/JP2006/306353, filed on Mar. 28, 2006.

(30) Foreign Application Priority Data
Apr. 28, 2005 (JP) .............................. 2005-133255

(51) Int. Cl.
H01L 41/24 (2006.01)
H01L 41/187 (2006.01)
C04B 35/495 (2006.01)

(52) U.S. Cl. .................. 252/62.9 R; 501/134; 310/311
(58) Field of Classification Search ............ 252/62.9 R; 501/134; 310/311
See application file for complete search history.

(56) References Cited

U.S. PATENT DOCUMENTS

| | | | | |
|---|---|---|---|---|
| 3,437,597 A | * | 4/1969 | Belloc | ................... 252/62.9 R |
| 5,637,542 A | * | 6/1997 | Takenaka | ................... 501/134 |
| 6,083,415 A | * | 7/2000 | Kimura et al. | .......... 252/62.9 R |
| 6,093,339 A | | 7/2000 | Kimura et al. | |
| 2002/0066882 A1 | | 6/2002 | Nishida et al. | |
| 2004/0058797 A1 | * | 3/2004 | Nonoyama et al. | .......... 501/134 |

FOREIGN PATENT DOCUMENTS

| | | |
|---|---|---|
| EP | 1 630 149 A1 | 3/2006 |
| JP | 11-228226 A | 8/1999 |
| JP | 2002-068835 | 3/2002 |
| JP | 2002-154872 | 5/2002 |
| JP | 2003-201175 | 7/2003 |

OTHER PUBLICATIONS

Written Opinion of the International Searching Authority dated May 2, 2006.

* cited by examiner

*Primary Examiner*—C. Melissa Koslow
(74) *Attorney, Agent, or Firm*—Dickstein Shapiro LLP (57) ABSTRACT

A main component has a general formula of $\{(1-x)(K_{1-a-b}Na_aLi_b)_m(Nb_{1-c-d}Ta_cSb_d)O_3-x(M1_{0.5}Bi_{0.5})_nM2O_3\}$ (wherein M1 is Ca, Sr or Ba, M2 is Ti, Zr or Sn, $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$). At least one specific element selected from the group consisting of In, Sc, Y, Nd, Sm, Eu, Gd, Tb, Dy, Ho, Er, Yb and Lu is contained at as in sample numbers 46 to 48, 0.1 to 10 mol in total per 100 mols of the main component (preferably, 1.5 to 10 mol). This provides a piezoelectric ceramic composition and a piezoelectric ceramic electronic component that can have a desired high piezoelectric d constant in a consistent and highly efficient manner in both a very low electric field and a high electric field.

13 Claims, 1 Drawing Sheet

PIEZOELECTRIC CERAMIC COMPOSITION AND PIEZOELECTRIC CERAMIC ELECTRONIC COMPONENT

This is a continuation of PCT/JP2006/306353, filed Mar. 28, 2006.

TECHNICAL FIELD

The present invention relates to a piezoelectric ceramic composition and a piezoelectric ceramic electronic component, and more particularly, to a piezoelectric ceramic composition, which does not contain Pb (lead), and a piezoelectric ceramic electronic component that includes the piezoelectric ceramic composition, such as a piezoelectric actuator or a piezoelectric buzzer.

BACKGROUND ART

In recent years, considering reducing the load on the environment, a lead-free piezoelectric ceramic composition has attracted attention. In general, lead-free piezoelectric ceramic composition is known to have a lower piezoelectric d constant than a lead-based piezoelectric ceramic composition, such as $PbTiO_3$—$PbZrO_3$ (PZT).

Under such circumstances, a (K, Na)$NbO_3$-based piezoelectric ceramic composition, which has a relatively large piezoelectric d constant (piezoelectric distortion constant) among non-lead piezoelectric ceramic compositions, has been studied actively.

For example, Patent Document 1 discloses a piezoelectric ceramic composition containing a main component having a general formula of $(1-n)(K_{1-x-y}Na_xLi_y)_m(Nb_{1-z}Ta_z)O_{3-n}M1M2O_3$ (wherein M1 is a bivalent metallic element, and M2 is a quadravalent metallic element). Patent Document 2 discloses a piezoelectric ceramic composition containing a main component having a general formula of $(1-n)(K_{1-x-y}Na_xLi_y)_m(Nb_{1-z}Ta_z)O_{3-n}M1M2M3O_3$ (wherein M1 is a trivalent metallic element, M2 is a monovalent metallic element, and M3 is a tetravalent metallic element). In Patent Documents 1 and 2, x, y, z, m, and n are in the ranges of $0.1 \leq x$, $y \leq 0.3$, $x+y<0.75$, $0 \leq z \leq 0.3$, $0.98 \leq m \leq 1.0$, and $0<n<0.1$.

In Patent Documents 1 and 2, a predetermined mol of a complex oxide $M1M2O_3$ or $M1M2M3O_3$ (for example, $BaTiO_3$, $CaTiO_3$, or $(Na_{0.5}Bi_{0.5})TiO_3$) of a perovskite type is dissolved as an additional component in (K, Na, Li)(Nb, Ta)$O_3$. The resulting piezoelectric ceramic composition has a relative dielectric constant $\in r$ $(= \in^T/\in_0; \in^T$ is the absolute dielectric constant, and $\in_0$ is the dielectric constant of free space) of at least 1000, an electromechanical coupling factor kp of at least 25%, and a Curie point Tc of more than 200 degrees C.

Patent Document 3 discloses a piezoelectric ceramic composition containing 0.005 to 0.15 mol of at least one metallic element selected from the group consisting of Ag, Al, Au, B, Ba, Bi, Ca, Ce, Co, Cs, Cu, Dy, Er, Eu, Fe, Ga, Gd, Ge, Hf, Ho, In, Ir, La, Lu, Mg, Mn, Nd, Ni, Pd, Pr, Pt, Rb, Re, Ru, Sc, Si, Sm, Sn, Sr, Tb, Ti, Tm, V, Y, Yb, Zn and Zr per one mol of a main component having a general formula of $\{Li_x(K_{1-y}Na_y)_{1-x}\}(Nb_{1-z-w}Ta_zSb_w)O_3$ (wherein $0 \leq x \leq 0.2$, $0 \leq y \leq 1$, $0 \leq z \leq 0.4$, and $0 < w \leq 0.2$) and has a percentage of open pores of 0.4% by volume or less.

Patent Document 3 indicates that the addition of the at least one metallic element selected from Ag to Zr described above to reduce the percentage of open pores (the volume percentage of hollows in the surface of a piezoelectric ceramic composition) to 0.4% by volume or less can improve the mechanical strength. In addition, Patent Document 3 indicates that since the piezoelectric ceramic composition contains a component having the general formula of $\{Li_x(K_{1-y}Na_y)_{1-x}\}(Nb_{1-z-w}Ta_zSb_w)O_3$ as a main component, the piezoelectric ceramic composition can utilize a high piezoelectric d constant and a high electromechanical coupling factor kp of the compound having the general formula to have these excellent characteristics.

Patent Document 4 discloses a piezoelectric ceramic composition having a general formula of $\{(K_{1-x}Na_x)_{1-y}Ag_y\}NbO_{3-z}[M^{\alpha+}][O^{2-}]_{\alpha/2}$ (wherein $0 \leq x < 1$, $0 \leq y \leq 0.1$, $0 \leq z \leq 0.05$, and $0 < y + z$; M denotes at least one metallic element selected from the group consisting of Mn, Mg, In, Si, Ga, and Sb), and $\alpha$ is the average valence of a metallic element M).

According to Patent Document 4, the addition of predetermined amounts of Ag and at least one metallic element selected from the group consisting of Mn, Mg, In, Si, Ga, and Sb to (K, Na)$NbO_3$ can decrease the dielectric loss tan $\delta$, improve the reliability, and increase the piezoelectric d constant.

[Patent Document 1] Japanese Unexamined Patent Application Publication No. 11-228227
[Patent Document 2] Japanese Unexamined Patent Application Publication No. 11-228228
[Patent Document 3] Japanese Unexamined Patent Application Publication No. 2004-244300
[Patent Document 4] Japanese Unexamined Patent Application Publication No. 2002-68835

DISCLOSURE OF INVENTION

Problems To Be Solved By The Invention

While in Patent Documents 1 and 2 the addition of $M1M2O_3$ or $M1M2M3O_3$ to (K, Na, Li)(Nb, Ta)$O_3$ as a third component provides a relative dielectric constant $\in r$ as high as at least 1000, the increase in the content of the third component causes a decrease in the electromechanical coupling factor kp. Thus, the piezoelectric d constant increases slightly but insufficiently.

More specifically, the relationship among the piezoelectric d constant, the dielectric constant $\in^T$, and the electrical coupling factor kp is expressed by a numerical formula (1):

$$d = kp\sqrt{\frac{\varepsilon^T}{Y}} \qquad (1)$$

wherein Y denotes Young's modulus.

Thus, it is desirable that both the relative dielectric constant $\in r$ and the electromechanical coupling factor kp are increased to yield a high piezoelectric d constant. However, although only the addition of $M1M2O_3$ or $M3M4M2O_3$ as a third component to (K, Na, Li)(Nb, Ta)$O_3$ as in Patent Documents 1 and 2, may increase the relative dielectric constant $\in r$, the increase in the content of the third component causes a decrease in the electromechanical coupling factor kp. Thus, there is a problem that a desired sufficiently high piezoelectric d constant cannot be obtained.

Patent Document 3 describes that the addition of a metallic element, such as In, to $\{Li_x(K_{1-y}Na_y)_{1-x}\}(Nb_{1-z-w}Ta_zSb_w)O_3$ can reduce the percentage of open pores to 0.4% by volume or less. According to an experiment by the present inventors, it was found that the piezoelectric d constant was not increased remarkably, and a piezoelectric ceramic composition having a desired high piezoelectric d constant could not be obtained.

Patent Document 4 describes that the addition of Ag and, for example, In to $(K, Na)NbO_3$ increases d31. However, it was found that the increase was small and a piezoelectric ceramic composition having a sufficiently high piezoelectric d constant could not be obtained.

Furthermore, with the recent technical progress in the preparation of thinner ceramics, a high-field driven stacked piezoelectric ceramic electronic component has been developed and put to practical use.

It is desired that a piezoelectric material for a high electric field driven piezoelectric ceramic electronic component have a high piezoelectric d constant in the high electric field practically used. However, the piezoelectric d constant in a high electric field practically used is generally different from the piezoelectric d constant usually measured in a very low electric field. Thus, a high piezoelectric d constant in a very low electric field does not always mean there is a high piezoelectric d constant in a high electric field.

More specifically, a piezoelectric material includes a large number of regions exhibiting spontaneous polarization in different directions, called domains. In a very low electric field, the only responsive domain is 180° domains exhibiting spontaneous polarization parallel to the direction of the electric field applied. In a high electric field, in addition to the response of the 180° domains, 90° domains, which exhibit spontaneous polarization perpendicular to the direction of the electric field applied, turn toward the direction of the electric field applied, generating a large distortion. Thus, the piezoelectric d constant in a high electric field can be greater than that in a very low electric field. However, in a high electric field having a strength beyond a certain electric field strength where most of the 90° domains become 180° domains, a large displacement can no longer be achieved. The structure of a domain may vary with the composition of a piezoelectric material. Thus, even when a piezoelectric material has a high piezoelectric d constant in a very low electric field, the piezoelectric material may not have a high piezoelectric d constant in a high electric field in a manner that depends on the domain structure.

Studies by the present inventors showed that in known lead-free piezoelectric ceramic compositions as described in Patent Documents 1 to 4, the piezoelectric d constant in a very low electric field may be increased slightly but insufficiently, and the piezoelectric d constant in a high electric field is much smaller than the desired piezoelectric d constant.

The present invention was accomplished in light of such circumstances. Accordingly, it is an object of the present invention to provide a non-lead piezoelectric ceramic composition that can achieve desired high piezoelectric d constants in both a very low electric field and a high electric field and a piezoelectric ceramic electronic component produced using the piezoelectric ceramic composition.

MEANS FOR SOLVING THE PROBLEMS

To achieve the object described above, the present inventors have conducted an intense study and found that a piezoelectric ceramic composition that contains a main component prepared by dissolving $M1_{0.5}Bi_{0.5}M2O_3$ (wherein M1 is K or Na, and M2 is Ti, Zr or Sn) having a perovskite structure as an additional component in a $(K, Na, Li)(Nb, Ta, Sb)O_3$-based compound having a predetermined molar ratio and another perovskite structure, and also contains about 0.1 to 10 mol in total of at least one specific element selected from the group consisting of In, Sc, Y, Nd, Sm, Eu, Gd, Tb, Dy, Ho, Er, Yb and Lu per 100 mol of the main component can have an increased relative dielectric constant ∈r, an increased electromechanical coupling factor kp, a high Curie point Tc, and the desired high piezoelectric d constants in both a very low electric field and a high electric field.

The present invention was achieved on the basis of such findings. A piezoelectric ceramic composition according to the present invention contains a main component having a general formula of $\{(1-x)(K_{1-a-b}Na_aLi_b)_m(Nb_{1-c-d}Ta_cSb_d)O_{3-x}(M1_{0.5}Bi_{0.5})_nM2O_3\}$ (wherein M1 is at least one metallic element selected from the group consisting of K and Na, M2 is at least one metallic element selected from the group consisting of Ti, Zr and Sn, and x, a, b, c, d, m and n are in the ranges of $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively), and about 0.1 to 10 mol in total of at least one specific element selected from the group consisting of In, Sc, Y, Nd, Sm, Eu, Gd, Tb, Dy, Ho, Er, Yb and Lu per 100 mols of the main component.

It was also found that when the piezoelectric ceramic composition is prepared to have the molar ratio m of $(K_{1-a-b}Na_aLi_b)$ and $(Nb_{1-c-d}Ta_cSb_d)$ in the range of $0.9 \leq m \leq 0.99$, the piezoelectric d constant in a high electric field can be improved further efficiently.

Thus, the m is preferably in the range of $0.9 \leq m \leq 0.99$ in a piezoelectric ceramic composition according to the present invention.

A known piezoelectric ceramic composition containing $(K, Na)NbO_3$ as a main component has a very narrow firing temperature range for preparing a satisfactory sintered compact. Practically, this causes a serious problem in mass production. Thus, it is desired that a satisfactory sintered compact can be prepared in a wider firing temperature range.

The present inventors have conducted an intense study and found that when a piezoelectric ceramic composition is prepared to contain about 1.5 to 10 mol in total of the specific element described above per 100 mol of the main component, the temperature range $\Delta T$ under which stable firing can be performed can be increased. Thus, fluctuations in the firing temperature during sintering have a smaller effect. This can reduce the number of defectives and thus increase productivity.

Thus, a piezoelectric ceramic composition according to the present invention preferably contains about 1.5 to 10 mol in total of the specific element per 100 mols of the main component.

In addition, it was found that the presence of about 0.1 to 10 mol in total of at least one metallic element selected from the group consisting of Mn, Ni, Fe, Zn, Cu and Mg per 100 mols of the main component can further increase the firing temperature range $\Delta T$.

Thus, the piezoelectric ceramic composition according to the present invention may further contain about 0.1 to 10 mol in total of at least one metallic element selected from the group consisting of Mn, Ni, Fe, Zn, Cu and Mg per 100 mols of the main component.

A piezoelectric ceramic electronic component according to the present invention includes an external electrode disposed on a surface of a piezoelectric ceramic element, wherein the piezoelectric ceramic element is formed of the piezoelectric ceramic composition described above.

Furthermore, the piezoelectric ceramic element may include an internal electrode in the piezoelectric ceramic electronic component according to the present invention.

ADVANTAGES OF THE INVENTION

A piezoelectric ceramic composition according to the present invention contains a main component having a general formula of $\{(1-x)(K_{1-a-b}Na_aLi_b)_m(Nb_{1-c-d}Ta_cSb_d)O_{3-x}(M1_{0.5}Bi_{0.5})_nM2O_3\}$ (wherein M1 is at least one metallic element selected from the group consisting of K and Na, M2 is at least one metallic element selected from the group consisting of Ti, Zr and Sn, and x, a, b, c, d, m and n are in the ranges of $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, respectively, and about 0.1 to 10 mol in total of at least one specific element selected from the group consisting of In, Sc, Y, Nd, Sm, Eu, Gd, Tb, Dy, Ho, Er, Yb and Lu per 100 mols of the main component. Thus, the piezoelectric d constant can be increased in both a very low electric field and a high electric field. Specifically, a piezoelectric ceramic composition thus produced can have excellent piezoelectric characteristics: the piezoelectric $d_{33}$ constant in a very low electric field is at least 105 pC/N and the piezoelectric d constant in a high electric field is at least 150 pC/N.

Furthermore, a piezoelectric ceramic composition according to the present invention can have further improved piezoelectric characteristics when the m is in the range of $0.9 \leq m \leq 0.99$. Specifically, a piezoelectric ceramic composition thus produced can have a piezoelectric $d_{33}$ constant in a very low electric field of at least 110 pC/N and the piezoelectric d constant in a high electric field of at least 180 pC/N.

Preferably, a piezoelectric ceramic composition according to the present invention contains about 1.5 to 10 mol in total of the specific element per 100 mol of the main component. This can increase the temperature range $\Delta T$ for stable firing and reduce the number of defectives even in the presence of fluctuations in the firing temperature. Specifically, the temperature range $\Delta T$ can be at least about 20 degrees C. Thus, the productivity can be improved.

Preferably, a piezoelectric ceramic composition according to the present invention further contains about 0.1 to 10 mol in total of at least one metallic element selected from the group consisting of Mn, Ni, Fe, Zn, Cu and Mg per 100 mols of the main component. This can further increase the firing temperature range $\Delta T$. Specifically, the addition of the bivalent metallic element described above can further increase the firing temperature range $\Delta T$ by about 10 to about 25 degrees C. Thus, the temperature range $\Delta T$ can be increased by about 45 to about 60 degrees C. in total.

A piezoelectric ceramic electronic component according to the present invention includes an external electrode disposed on a surface of a piezoelectric ceramic element, wherein the piezoelectric ceramic element is formed of the piezoelectric ceramic composition described above. Thus, a piezoelectric ceramic electronic component having a high piezoelectric constant in not only a very low electric field but also a high electric field can consistently be produced.

A piezoelectric ceramic electronic component according to the present invention may have a piezoelectric ceramic element including an internal electrode. Thus, even a high-field driven stacked piezoelectric ceramic electronic component, such as a piezoelectric actuator, can have a high piezoelectric d constant at a driving electric field. Thus, a piezoelectric ceramic electronic component having excellent piezoelectric characteristics can be produced in a consistent and highly efficient manner.

REFERENCE NUMERALS

1 piezoelectric ceramic element
2a, 2b external electrode
3 internal electrode

BEST MODE FOR CARRYING OUT THE INVENTION

The present invention will be further illustrated with embodiments below.

A piezoelectric ceramic composition according to one embodiment (first embodiment) of the present invention is expressed by a general formula (A):

$$100\{(1-x)(K_{1-a-b}Na_aLi_b)_m(Nb_{1-c-d}Ta_cSb_d)O_{3-x}(M1_{0.5}Bi_{0.5})_nM2O_3\}+(\alpha/2)X_2O_3 \qquad (A)$$

wherein M1 is at least one metallic element selected from the group consisting of K and Na, M2 is at least one metallic element selected from the group consisting of Ti, Zr and Sn, and X is at least one specific element selected from the group consisting of In, Sc, Y, Nd, Sm, Eu, Gd, Tb, Dy, Ho, Er, Yb and Lu.

The $\alpha$, x, a, b, c, d, m and n satisfy numerical formulas (2) to (10):

$$0.1 \leq \alpha \leq 10 \qquad (2)$$

$$0.005 \leq x \leq 0.5 \qquad (3)$$

$$0 \leq a \leq 0.9 \qquad (4)$$

$$0 \leq b \leq 0.3 \qquad (5)$$

$$0 \leq a+b \leq 0.9 \qquad (6)$$

$$0 \leq c \leq 0.5 \qquad (7)$$

$$0 \leq d \leq 0.1 \qquad (8)$$

$$0.9 \leq m \leq 1.1 \qquad (9)$$

$$0.9 \leq n \leq 1.1 \qquad (10)$$

Thus, the piezoelectric ceramic composition contains a main component $\{(K_{1-a-b}Na_aLi_b)_m(Nb_{1-c-d}Ta_cSb_d)O_{3-}(M1_{0.5}Bi_{0.5})_nM2O_3\}$ of a perovskite structure (general formula $ABO_3$) prepared to have a predetermined molar ratio and about 0.1 to 10 mol of a specific element X, such as In or Sc, per 100 mols of the main component. The piezoelectric ceramic composition can have high piezoelectric d constants in both a very low electric field and a high electric field and desired piezoelectric characteristics.

In other words, as described in Background Art, a solid solution of a perovskite complex oxide component having a specific composition dissolved as a third component in (K, Na, Li)(Nb, Ta)$O_3$ can have a high piezoelectric d constant. However, a simple solid solution of a perovskite complex oxide component having a specific composition only dissolved in (K, Na, Li)(Nb, Ta)O$_3$ cannot have a sufficiently high piezoelectric d constant (for example, at least 100 pC/N). The simple solid solution has piezoelectric characteristics inferior to those of a lead-based piezoelectric ceramic composition particularly in a high electric field.

Figure 1:
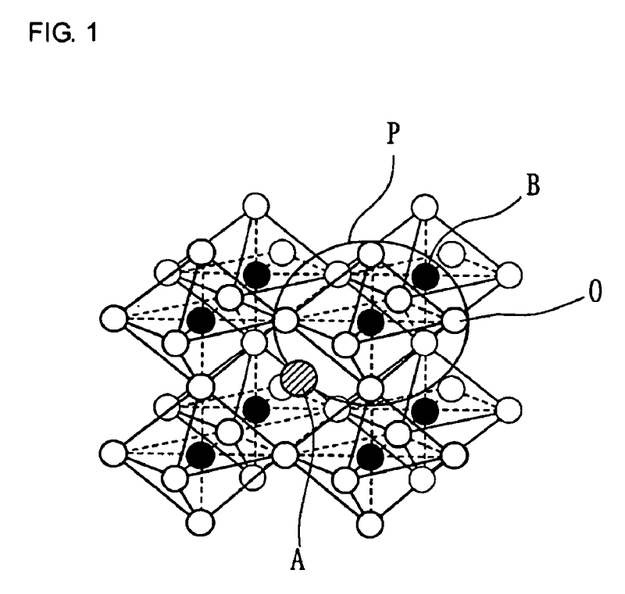
FIG. 1 is a schematic single view drawing of a perovskite oxygen octahedral structure.

As illustrated in FIG. 1, a perovskite structure has a B site ion-centered oxygen octahedral skeleton and an A site ion coordinating in the skeletal space. In FIG. 1, P represents an oxygen octahedral skeleton, a black sphere represents a B site ion, a hatched sphere represents an A site ion, and a white sphere (reference numeral 0) represents an O$^{2-}$ ion.

In (K, Na)NbO$_3$, fFor example, the A site ions K$^+$ and Na$^+$ coordinate in a B site ion Nb$^{5+}$-centered oxygen octahedral skeleton. In (Na$_{0.5}$Bi$_{0.5}$)$_n$TiO$_3$, A site ions Na$^+$ and Bi$^{3+}$ coordinate in a B site ion Ti$^{4+}$-centered oxygen octahedral skeleton.

To prepare a uniform solid solution of complex oxides of different compositions having the perovskite structure, their B site ion-centered oxygen octahedral structures must naturally be commensurate with each other.

When the valencies of B site ions are identical as in (K, Na)NbO$_3$ and LiSbO$_3$, the B site ions Nb$^{5+}$ and Sb$^{5+}$ blend with each other relatively freely. Thus, a totally uniform oxygen octahedral skeleton can be formed in a solid solution of these, and their B site ion-centered oxygen octahedral structures can be commensurate with each other.

However, when a solid solution is prepared from perovskite complex oxides having different B site ion valencies, such as (K, Na)NbO$_3$ and (Na$_{0.5}$Bi$_{0.5}$)$_n$TiO$_3$, only Nb$^{5+}$ ions dissolve in the surroundings of a K$^+$ ion and only Ti$^{4+}$ ions dissolve in the surroundings of a Bi$^{3+}$ ion to maintain the balance of local charges. Thus, the Nb$^{5+}$ ions and the Ti$^{4+}$ ions cannot blend with each other freely and form oxygen octahedral structures having different sizes. In this case, the oxygen octahedral structures between the perovskite complex oxides commensurate poorly with each other. This makes it difficult to prepare an excellent piezoelectric ceramic composition, compromising the piezoelectricity.

In the present embodiment, the addition of a predetermined mol of a specific element, such as In or Sc, to the main component allows oxygen octahedral structures of different perovskite complex oxides to be commensurate with each other, providing high piezoelectric d constants in both a very low electric field and a high electric field.

More specifically, when In, for example, in an oxide form is added as a specific element in addition to (K$_{0.5}$Na$_{0.5}$)NbO$_3$ and (Na$_{0.5}$Bi$_{0.5}$)$_n$TiO$_3$, as shown in reaction formula (B), part of In replaces part of K and Na in (K$_{0.5}$Na$_{0.5}$)NbO$_3$ and part of Ti in (Na$_{0.5}$Bi$_{0.5}$)$_n$TiO$_3$. Furthermore, In acts to maintain the total balance of charges and blends with part of Nb and Ti.

100{(1−x)(K$_{0.5}$Na$_{0.5}$)NbO$_{3+x}$(Na$_{0.5}$Bi$_{0.5}$)$_n$TiO$_3$}+(α/2)In$_2$O$_3$→100{(1−x−(α/200))(K$_{0.5}$Na$_{0.5}$)NbO$_3$−(x−α/100))(Na$_{0.5}$Bi$_{0.5}$)$_n$TiO$_3$−(α/100)(K$_{0.25}$Na$_{0.25}$In$_{0.5}$)TiO$_3$−(α/100)(Na$_{0.5}$Bi$_{0.5}$)(In$_{0.5}$Nb$_{0.5}$)O$_3$}   (B)

Since In$^{3+}$ ions blend with A site ions and B site ions, the mixed layer reduces mismatching between different perovskite complex oxides to be naturally commensurate with each other, thus forming a matching layer. The presence of a matched layer of {(α/100)(K$_{0.25}$Na$_{0.25}$In$_{0.5}$)TiO$_3$−(α/100)(Na$_{0.5}$Bi$_{0.5}$)(In$_{0.5}$Nb$_{0.5}$)O$_3$} can provide a sufficiently high piezoelectric d constant even in a very low electric field. Since the matching layer is believed to form a domain wall, a large number of small domains are expected to be formed, as compared with a solid solution of perovskite complex oxides having the same valency of B site ions. Each of the large number of small domains expand, contract, and rotate in a high electric field to generate large deformation and distortion in total. This achieves a much higher piezoelectric d constant in a high electric field than that of a solid solution of perovskites having the same valency of B site ions. This may provide a piezoelectric ceramic composition having excellent piezoelectric characteristics and a high piezoelectric d constant in not only a very low electric field but also a high electric field.

The specific element X is limited to at least one element selected from the group consisting of In, Sc, Y, Nd, Sm, Eu, Gd, Tb, Dy, Ho, Er, Yb and Lu. Although all the specific elements X described above are trivalent metallic elements, it does not mean that any trivalent metallic element can be used. For example, Bi or La is not appropriate as an additive element. Thus, the specific element X is limited to the metallic elements described above.

Then, reasons that α, x, a, b, c, d, m and n are limited to the ranges of the numerical formulas (2) to (10) are described in detail below.

(1) α

The addition of a specific element, such as In, can increase the piezoelectric d constants in both a very low electric field and a high electric field. To this end, the number of moles α of the specific element X should be at least about 0.1 mol per 100 mols of the main component. However, when the number of moles α of the specific element X is more than about 10 mol per 100 mols of the main component, the content of the specific element X exceeds the solubility limit. The specific element X that cannot be dissolved in a solid solution may be precipitated on the grain boundary to form a conductive layer, causing poor polarization.

Thus, a piezoelectric ceramic composition is prepared to have the number of moles α of the specific element X per 100 mol of the main component in the range of in the present embodiment, $0.1 \leq \alpha \leq 10$ in the present embodiment.

When the number of moles α is in the range of $1.5 \leq \alpha \leq 10$, the temperature range ΔT for stable firing can be increased.

In a known piezoelectric ceramic composition, the temperature range ΔT for stable firing is very narrow. Fluctuations in the firing temperature may increase the occurrence of defectives and decrease the productivity.

The present inventors found that the number of moles α of the specific element X in the range of $1.5 \leq \alpha \leq 10$ per 100 mol of a main component allows the temperature range ΔT for stable firing to be increased. This allows a margin for fluctuations in the firing temperature; a little fluctuation in the firing temperature is not detrimental to sintering. Thus, a piezoelectric ceramic composition having excellent piezoelectric characteristics can be produced in a consistent and highly efficient manner. Specifically, the firing temperature range ΔT can be at least 20 degrees C. Thus, the number of moles α of the specific element X is preferably in the range of $1.5 \leq \alpha \leq 10$ per 100 mol of the main component.

(2) x x defines the molar ratio of a third component (M1$_{0.5}$Bi$_{0.5}$)$_n$M2O$_3$ in a main component. When x is less than 0.005, the content of (M1$_{0.5}$Bi$_{0.5}$)$_n$M2O$_3$ is too low. This decreases the relative dielectric constant ∈r and the electromechanical coupling factor kp. Thus, a desired high piezoelectric d constant cannot be achieved, and the piezoelectric characteristics cannot be improved. When x is more than 0.5, the Curie point Tc decreases remarkably and the electromechanical coupling factor kp decreases rapidly and the piezoelectric characteristics become deteriorated.

Thus, components of a composition in the present embodiment are prepared so that x is in the range of $0.005 \leq x \leq 0.5$.

(3) a, b

Na and Li are contained in a main component if necessary. Na and Li replace part of K in a solid solution. When a, which defines the molar ratio of Na, exceeds 0.9, a ferroelectric cannot be formed. When b, which defines the molar ratio of Li, exceeds 0.3, the amount of Li exceeds the solubility limit with K. Both cases result in lack of piezoelectricity. Furthermore, when the total of a and b exceeds 0.9, the relative dielectric constant $\in r$ decreases remarkably. Thus, a desired high piezoelectric d constant cannot be achieved.

Thus, components of a composition in the present embodiment are prepared so that a and b are in the ranges of $0 \leq a \leq 0.9$, $0 \leq b \leq 0.3$, and $0 \leq a+b \leq 0.9$.

(4) c

Ta is also contained in a main component if necessary. Ta replaces part of Nb in a solid solution. When c, which defines the molar ratio of Ta, exceeds 0.5, the electromechanical coupling factor kp decreases greatly, the piezoelectric d constants in both a very low electric field and a high electric field decrease remarkably, and thus desired piezoelectric characteristics cannot be obtained.

Thus, components of a composition in the present embodiment are prepared so that c is in the range of $0 \leq c \leq 0.5$.

(5) d

Sb is contained in a main component if necessary. Sb replace part of Nb in a solid solution. When d, which defines the molar ratio of Sb, exceeds 0.1, the Curie point Tc decreases remarkably. This results in lack of piezoelectricity.

Thus, components of a composition in the present embodiment are prepared so that d is in the range of $0 \leq d \leq 0.1$.

(6) m m defines the molar ratio of A sites and B sites in $(K_{1-a-b}Na_aLi_b)_m(Nb_{1-c-d}Ta_cSb_d)O_3$. When m is less than 0.9, the molar ratio of an A site is too small. This greatly decreases the electromechanical coupling factor kp and remarkably decreases the piezoelectric d constants in both a very low electric field and a high electric field. Thus, desired piezoelectric characteristics cannot be obtained. When m exceeds 1.1, the molar ratio of an A site becomes excessive. This causes poor sintering.

Thus, components of a composition in the present embodiment are prepared so that m is in the range of $0.9 \leq m \leq 1.1$. Preferably, m is in the range of $0.9 \leq m \leq 0.99$ to achieve a higher piezoelectric d constant.

(7) n n defines the molar ratio of A sites and B sites in $(M1_{0.5}Bi_{0.5})_nM2O_3$. When n is less than 0.9 or more than 1.1, the electromechanical coupling factor kp decreases greatly, and the piezoelectric d constants in both a very low electric field and a high electric field decrease remarkably. Thus, desired piezoelectric characteristics cannot be obtained. When n exceeds 1.1, the molar ratio of an A site becomes excessive. This causes poor sintering.

Thus, components of a composition in the present embodiment are prepared so that n is in the range of $0.9 \leq n \leq 1.1$.

In the present embodiment, a piezoelectric ceramic composition having the general formula (A) is prepared to satisfy the numerical formulas (2) to (10). This can provide a piezoelectric ceramic composition having high piezoelectric d constants in both a very low electric field and a high electric field and excellent piezoelectric characteristics.

Furthermore, a piezoelectric ceramic composition is prepared so that the number of moles α of the specific element X is in the range of $1.5 \leq \alpha \leq 10$ per 100 mol of a main component. Thus, the temperature range ΔT for stable firing can be increased. This allows a piezoelectric ceramic composition having a desired piezoelectric d constant and excellent piezoelectric characteristics to be produced in a consistent and highly efficient manner. Thus, the productivity can be improved.

The present invention is not limited to the piezoelectric ceramic composition according to the embodiment described above. It is also preferred to add in the present embodiment, 0.1 to 10 mol of at least one element selected from the group consisting of Mn, Ni, Fe, Zn, Cu and Mg to 100 mols of a main component composed of a solid solution in a general formula (A). This can further increase the firing temperature range ΔT and further improve the productivity (second embodiment).

In this case, a piezoelectric ceramic composition can be expressed by a general formula (C):

$$100\{(1-x-y)(K_{1-a-b}Na_aLi_b)_m(Nb_{1-c-d}Ta_cSb_d)O_{3-x}(M1_{0.5}Bi_{0.5})_nM2O_3\}+(\alpha/2)X_2O_3+\beta[Z^{q+}][O^{2-}]_{(q/2)} \quad (C)$$

wherein Z is at least one metallic element selected from the group consisting of Mn, Ni, Fe, Zn, Cu and Mg.

The reason that the addition of Mn, Ni, Fe, Zn, Cu or Mg to the main component can increase the firing temperature range ΔT is thought to be that the element dissolved in a crystal grain serves to compensate for the charge and facilitates the formation of a matching layer and thereby improves sintering.

The reason that the additive level is in the present embodiment, 0.1 to 10 mol per 100 mols of the main component is that at least in the present embodiment, 0.1 mol per 100 mol of a main component is required to further increase the firing temperature range ΔT, and that the additive level of more than in the present embodiment, 10 mol may cause poor sintering.

Thus, when Mn, Ni, Fe, Zn, Cu or Mg is added to a main component, the preparation should be performed so that its content is in the present embodiment, 0.1 to 10 mol per 100 mols of the main component.

A piezoelectric ceramic electronic component produced using the piezoelectric ceramic composition described above is described below.

Figure 2:
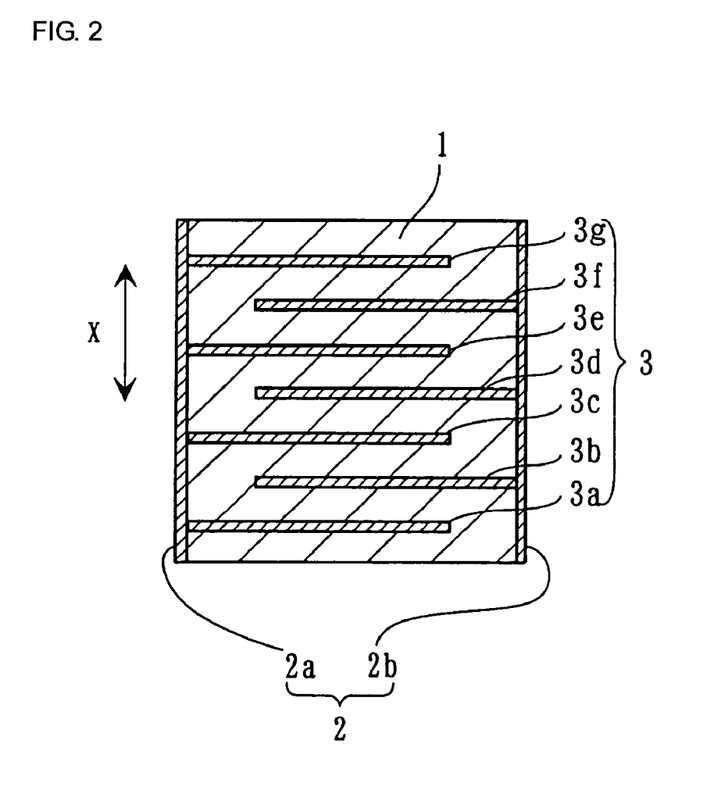
FIG. 2 is a cross-sectional view of a stacked piezoelectric actuator as a piezoelectric ceramic electronic component according to one embodiment of the present invention.

FIG. 2 is a cross-sectional view of a stacked piezoelectric actuator as a piezoelectric ceramic electronic component according to one embodiment of the present invention. The stacked piezoelectric actuator includes a piezoelectric ceramic element 1, external electrodes 2 (2a and 2b) formed on both ends of the piezoelectric ceramic element 1 and composed of an electrical conductivity material, such as Ag, and internal electrodes 3 (3a to 3g) included in parallel with each other in the opposite direction in the piezoelectric ceramic element 1 and composed of an electrical conductive material, such as Ag or Ag—Pd.

In the stacked piezoelectric actuator, one end of each of the internal electrodes 3a, 3c, 3e, and 3g is electrically connected to one external electrode 2a, and one end of each of the internal electrodes 3b, 3d, and 3f is electrically connected to the other external electrode 2b. When a voltage is applied between the external electrode 2a and the external electrode 2b, the stacked piezoelectric actuator shifts in a stacked direction indicated by an arrow (FIG. 2, reference numeral X) because of a longitudinal piezoelectric effect.

A method for manufacturing the stacked piezoelectric actuator is described in detail below.

Predetermined amounts of at least one compound selected from the group consisting of $TiO_2$, $ZrO_2$ and $SnO_2$; at least one compound selected from the group consisting of $In_2O_3$, $Sc_2O_3$, $Y_2O_3$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Yb_2O_3$ and $Lu_2O_3$; $K_2CO_3$; $Nb_2O_5$; $Bi_2O_3$; $Na_2CO_3$, $Li_2CO_3$ if necessary; and at least one compound selected from the group consisting of $MnCO_3$, NiO, $Fe_2O_3$, ZnO, CuO and $MgCO_3$ if necessary are weighed as raw materials for a ceramic. The weighed raw materials are charged in a ball mill containing grinding media, such as zirconia, are wet-blended sufficiently, and are dried to yield a ceramic raw powder.

Subsequently, the ceramic raw powder is calcined at a predetermined temperature (for example, 600 to 1000 degrees C.). The calcined powder is again wet-ground in a ball mill to produce a raw powder before sintering.

Then, the raw powder before sintering and an organic binder are wet-blended to form a slurry. Subsequently, a ceramic green sheet is produced, for example, by a doctor blade method.

Then, an electrical conductive paste containing a main component of Ag or Ag—Pd for an internal electrode is used to screen-print the ceramic green sheet, thus forming an electrode pattern.

Then, the ceramic green sheets on which the electrode pattern is screen-printed are stacked and are subsequently sandwiched between ceramic green sheets on which no electrode pattern is screen-printed. These ceramic green sheets are attached by pressure to form a stacked body. Then, the stacked body is cut into pieces having a predetermined size. The pieces are placed in an alumina case and are calcined at a predetermined temperature (for example, 250 to 500 degrees C.) to remove the binder. Then, the pieces are fired at a predetermined temperature (for example, 1050 to 1200 degrees C.) to form a piezoelectric ceramic element including internal electrodes therein.

Subsequently, ann electrical conductive paste, for example, containing Ag for an external electrode is applied to both ends of the piezoelectric ceramic element, and is baked at a predetermined temperature (for example, 750 to 850 degrees C.) to form external electrodes 2a and 2b. Then, prescribed poling is performed to produce a stacked piezoelectric actuator. It is essential only that the external electrodes 2a and 2b have satisfactory adhesiveness. Thus, the external electrodes 2a and 2b may be formed by a thin-film forming method, for example, sputtering or vacuum evaporation.

In the present embodiment, a stacked piezoelectric actuator is produced using a piezoelectric ceramic composition according to the present invention. Even when a high electric field of 1 kV/mm is applied, the piezoelectric actuator can have a large piezoelectric d constant and exhibit a large displacement.

The present invention is not limited to the embodiments described above. In those embodiments, a stacked piezoelectric actuator is described as a piezoelectric ceramic electronic component. The present invention can also be applied to a single-plate piezoelectric actuator and a bimorph piezoelectric actuator. Furthermore, it is needless to say that the piezoelectric ceramic composition can be used in various piezoelectric ceramic electronic components, such as a piezoelectric resonator, a piezoelectric buzzer, and a piezoelectric sensor.

Then, the present invention will be specifically described with Examples below.

EXAMPLE 1

$K_2CO_3$, $Na_2CO_3$, $Nb_2O_5$, $Bi_2O_3$, $TiO_2$, $ZrO_2$, $SnO_2$, $In_2O_3$, $Sc_2O_3$, $Yb_2O_3$, $Y_2O_3$, $Nd_2O_3$, $Eu_2O_3$, $Gd_2O_3$, $Dy_2O_3$, $Sm_2O_3$, $Ho_2O_3$, $Er_2O_3$, $Tb_4O_7$ and $Lu_2O_3$ were prepared as raw materials for ceramics.

These raw materials for ceramics were weighed to prepare compositions shown in Table 1. The weighed raw materials were wet-blended in alcohol in a ball mill for 18 hours. Each of the resulting mixtures was dried and calcined at 700 to 1000 degrees C.

Then, the calcined mixture was roughly ground. The ground mixture and a proper amount of an organic binder were wet-ground in a ball mill for 16 hours and sifted through a 40-mesh sieve to control the particle size.

Then, the powder having a controlled particle size was pressed at a pressure of $9.8 \times 10^7$ to $1.96 \times 10^8$ Pa into a discoidal compact having a diameter of 10 mm and a thickness of 1.2 mm. The compact was fired at a temperature of 1050 to 1200 degrees C. in the air for two hours to produce a ceramic element.

A compact was fired for two hours every five degree C. between 1050 and 1200 degrees C. The piezoelectric $d_{33}$ constant at each firing temperature was measured with a $d_{33}$ meter. The firing temperature at a maximum piezoelectric $d_{33}$ constant was considered as an optimum firing temperature. A firing temperature range in which at least 80% of the maximum piezoelectric $d_{33}$ constant can be achieved was considered as the firing temperature range $\Delta T$ for stable firing.

Then, Ag electrodes were formed on both main surfaces of the ceramic element by vacuum evaporation. Subsequently, the ceramic element was polarized in an isolating oil at a bath temperature of 20 to 180 degrees C. by applying a 2 to 10 kV/mm direct-current voltage for 10 to 30 minutes. Thus, compositions of sample numbers 1 to 27 having a general formula of $100\{(1-x)(K_{0.5}Na_{0.5})_{0.98}NbO_{3-x}(M1_{0.5}Bi_{0.5})_n M2O_3\} + (\alpha/2)X_2O_3$ were prepared.

Table 1 illustrates the compositions of sample numbers 1 to 27.

TABLE 1

| Sample No. | Composition: $100\{(1-x)(K_{0.5}Na_{0.5})_{0.98}NbO_3 - x(M1_{0.5}Bi_{0.5})M2O_3\} + (\alpha/2)X_2O_3$ | | | | |
| --- | --- | --- | --- | --- | --- |
| | x | M1 | M2 | X | α |
| 1 | 0.05 | Na | Ti | In | 2 |
| 2 | 0.05 | Na | Ti | Sc | 2 |
| 3 | 0.05 | Na | Ti | Yb | 2 |
| 4 | 0.05 | Na | Ti | Y | 2 |
| 5 | 0.05 | Na | Ti | Nd | 2 |
| 6 | 0.05 | Na | Ti | Eu | 2 |
| 7 | 0.05 | Na | Ti | Gd | 2 |
| 8 | 0.05 | Na | Ti | Dy | 2 |
| 9 | 0.05 | Na | Ti | Sm | 2 |
| 10 | 0.05 | Na | Ti | Ho | 2 |
| 11 | 0.05 | Na | Ti | Er | 2 |
| 12 | 0.05 | Na | Ti | Tb | 2 |
| 13 | 0.05 | Na | Ti | Lu | 2 |
| 14 | 0.05 | Na | Ti | Yb/In | 1/1 |
| 15 | 0.05 | Na | Ti | Y/In | 1/1 |
| 16* | 0.05 | Na | Ti | Bi | 2 |
| 17* | 0.05 | Na | Ti | La | 2 |
| 18* | 0.05 | Na | Ti | — | — |
| 19 | 0.05 | Na | Ti | In | 0.1 |
| 20 | 0.05 | Na | Ti | In | 1 |

TABLE 1-continued

| Sample No. | Composition: $100\{(1-x)(K_{0.5}Na_{0.5})_{0.98}NbO_3 - x(M1_{0.5}Bi_{0.5})M2O_3\} + (\alpha/2)X_2O_3$ | | | | |
|---|---|---|---|---|---|
| | x | M1 | M2 | X | α |
| 21 | 0.05 | Na | Ti | In | 1.5 |
| 22 | 0.05 | Na | Ti | In | 10 |
| 23* | 0.05 | Na | Ti | In | 15 |
| 24 | 0.05 | Na | Zr | In | 2 |
| 25 | 0.05 | Na | Sn | In | 2 |
| 26 | 0.05 | K | Ti | In | 2 |
| 27* | — | — | — | In | 2 |

*means outside of the scope of the present invention.

The piezoelectric $d_{33}$ constant was determined with a $d_{33}$ meter from the amount of electric charge generated under oscillation corresponding to the application of an electric field of about 1 V/mm.

The piezoelectric $d_{33}$ constant in a high electric field was calculated by measuring the displacement in the thickness direction in an electric field of 1 kV/mm in the thickness direction with a displacement gage, calculating the distortion factor by dividing the displacement by the thickness, and dividing the distortion factor by the electric field.

The Curie point Tc was determined by analyzing a temperature characteristic of the relative dielectric constant ∈r and calculating the temperature at a maximum relative dielectric constant ∈r.

Table 2 gives the measurements and the firing temperature ranges ΔT for sample numbers 1 to 27.

TABLE 2

| Sample No. | Relative dielectric constant ∈r | Electromechanical coupling factor kp (%) | Piezoelectric $d_{33}$ constant (pC/N) | Piezoelectric $d_{33}$ constant in a high electric field (pC/N) | Curie point Tc (° C.) | Firing temperature range ΔT (° C.) |
|---|---|---|---|---|---|---|
| 1 | 790 | 50.1 | 242 | 393 | 310 | 35 |
| 2 | 765 | 47.3 | 221 | 364 | 310 | 35 |
| 3 | 810 | 37.2 | 165 | 274 | 290 | 35 |
| 4 | 910 | 31.6 | 157 | 261 | 280 | 35 |
| 5 | 890 | 27.0 | 130 | 218 | 290 | 25 |
| 6 | 896 | 29.4 | 143 | 239 | 290 | 25 |
| 7 | 810 | 29.2 | 133 | 223 | 300 | 25 |
| 8 | 863 | 32.2 | 146 | 244 | 290 | 35 |
| 9 | 846 | 35.4 | 165 | 274 | 290 | 35 |
| 10 | 736 | 33.6 | 142 | 237 | 300 | 35 |
| 11 | 856 | 35.2 | 165 | 274 | 290 | 35 |
| 12 | 860 | 27.2 | 121 | 210 | 290 | 35 |
| 13 | 765 | 47.2 | 225 | 370 | 310 | 35 |
| 14 | 854 | 49.5 | 237 | 385 | 300 | 40 |
| 15 | 843 | 48.7 | 233 | 383 | 300 | 40 |
| 16* | 654 | 13.5 | 63 | 93 | 260 | Low reproducibility |
| 17* | 573 | 11.8 | 52 | 74 | 270 | Fraction defective ≧95% |
| 18* | 623 | 15.4 | 64 | 90 | 310 | |
| 19 | 763 | 24.3 | 112 | 182 | 310 | 5 |
| 20 | 772 | 24.8 | 114 | 186 | 310 | 10 |
| 21 | 788 | 48.3 | 231 | 381 | 310 | 30 |
| 22 | 782 | 49.5 | 230 | 376 | 310 | 30 |
| 23* | | | No piezoelectricity | | | |
| 24 | 675 | 46.3 | 201 | 332 | 310 | 40 |
| 25 | 576 | 44.2 | 182 | 301 | 310 | 40 |
| 26 | 593 | 44.3 | 183 | 303 | 310 | 35 |
| 27* | 380 | 30.1 | 93 | 124 | 400 | 20 |

*means outside of the scope of the present invention.

In the sample numbers 1 to 27, the relative dielectric constant ∈r, the electromechanical coupling factor kp, the piezoelectric $d_{33}$ constant in a very low electric field (hereinafter referred to simply as "piezoelectric $d_{33}$ constant"), the piezoelectric $d_{33}$ constant measured in a high electric field (hereinafter referred to as "piezoelectric $d_{33}$ constant in a high electric field"), and the Curie point Tc were measured.

The relative dielectric constant ∈r was determined from the capacitance measured with an impedance analyzer and the sample size. The electromechanical coupling factor kp was determined by a resonance-antiresonance method using an impedance analyzer.

Sample numbers 1 to 17 contain a total of 2 mols of trivalent metallic elements per 100 mols of main component having a composition formula of $\{0.95(K_{0.5}Na_{0.5})_{0.98}NbO_{3-0.05}(Na_{0.5}Bi_{0.5})TiO_3\}$.

Sample numbers 1 to 15 contain a specific element (In, Sc, Yb, Y, Nd, Eu, Gd, Dy, Sm, Ho, Er, Tb and Lu) according to the present invention. Thus, they have a high relative dielectric constant ∈r and a high electromechanical coupling factor kp. As a result, sample numbers 1 to 15 have piezoelectric $d_{33}$ constants of at least 105 pC/N and piezoelectric $d_{33}$ constants in a high electric field of at least 150 pC/N, and thus exhibit excellent piezoelectric characteristics.

Furthermore, it was found that when the number of moles α of each metallic element was 2 mol per 100 mol of a main component and was in the range of 1.5 to 10 mol, the temperature range ΔT for stable firing could be increased to 25 to 40 degrees C.

By contrast, sample numbers 16 and 17 contained Bi or La as a trivalent metallic element (i.w., other than the specific element) and had very low electromechanical coupling factors kp. Thus, sample numbers 16 and 17 had low piezoelectric $d_{33}$ constants and low piezoelectric $d_{33}$ constants in a high electric field, and did not have the desired piezoelectric characteristics. Furthermore, the firing temperature fluctuated. This resulted in poor reproducibility even when firing was performed at the same temperature. The fraction of defectives was at least 95%. This is probably because Bi or La cannot dissolve in the B site of $BaTiO_3$, and a matched layer between $(K_{0.5}Na_{0.5})NbO_3$ and $(Na_{0.5}Bi_{0.5})TiO_3$ could not consistently be formed.

Sample number 18 did not contain an additive element in the main component. As in sample numbers 16 and 17, sample number 18 had a very low electromechanical coupling factor kp. As a result, sample number 18 had a low piezoelectric $d_{33}$ constant and a low piezoelectric $d_{33}$ constant in a high electric field, and did not have desired piezoelectric characteristics. Furthermore, the firing temperature fluctuated. This resulted in poor reproducibility even when firing was performed at the same temperature. The fraction of defectives was at least 95%.

These results showed that it is important to add the specific element within the scope of the present invention to a main component to improve the piezoelectric characteristics.

Sample numbers 19 to 23 contain different molar amounts of In for a main component having a composition formula of $\{0.95(K_{0.5}Na_{0.5})_{0.98}NbO_3-0.05(Na_{0.5}Bi_{0.5})TiO_3\}$.

Sample number 23 was poorly polarized and did not exhibit piezoelectricity. This is probably because the molar amount of In was am excessive 15 mols per 100 mols of the main component, and In undissolved in the main component was deposited on a grain boundary and formed a conductive layer.

By contrast, it was found that when 0.1 to 10 mol of In was added to 100 mol of a main component, in sample numbers 19 to 22, that the piezoelectric $d_{33}$ constants were at least 105 pC/N, the piezoelectric $d_{33}$ constants in a high electric field were at least 150 pC/N, and thus the piezoelectric characteristics were excellent.

In sample numbers 21 and 22, the numbers of moles α of In were in sample numbers 19 to 22, 1.5 to 10 mol per 100 mols of a main component, the piezoelectric $d_{33}$ constants and the piezoelectric $d_{33}$ constants in a high electric field were further improved, as compared with sample numbers 19 and 20. It was also found that the firing temperature ranges ΔT were also increased. This is probably because when the In content was less than 1.5 mol, a matching layer between $(K_{0.5}Na_{0.5})NbO_3$ and $(Na_{0.5}Bi_{0.5})TiO_3$ was insufficiently formed, the piezoelectric characteristics became slightly poorer, and the firing temperature range ΔT was as narrow as 10 degrees C. or less, but when the In content was at least 1.5 mol, a desired matching layer was formed and thereby a desired stable piezoelectric ceramic composition was prepared.

In sample numbers 24 to 26 containing different components of $(M1_{0.5}Bi_{0.5})M2O_3$ within the scope of the present invention, it was found that the piezoelectric $d_{33}$ constants were at least 105 pC/N, the piezoelectric $d_{33}$ constants in a high electric field were at least 150 pC/N, and thus the piezoelectric characteristics were excellent. It was also found that the firing temperature range ΔT could also be increased to 35 to 40 degrees C. Thus, it was shown that at least one element selected from the group consisting of Na and K could be used as M1, and at least one element selected from the group consisting of Ti, Zr and Sn could be used as M2.

In sample number 27, which did not contain $(M1_{0.5}Bi_{0.5})M2O_3$ in the composition, the piezoelectric $d_{33}$ constant was less than 105 pC/N and a piezoelectric $d_{33}$ constant in a high electric field was less than 150 pC/N. Thus, it was shown that sample number 27 could not have desired excellent piezoelectric characteristics.

Embodiment 2

$K_2CO_3$, $Na_2CO_3$, $Li_2CO_3$, $Nb_2O_5$, $Ta_2O_5$, $Sb_2O_5$, $Bi_2O_3$, $TiO_2$ and $In_2O_3$ were prepared as raw materials for ceramics. These raw materials for ceramics were weighed to prepare the compositions shown in Table 3. Test specimens of sample numbers 31 to 55 were produced by the same method and procedures as in Example 1. The firing temperature range ΔT was also determined as in Example 1.

The relative dielectric constant ∈r, the electromechanical coupling factor kp, the piezoelectric $d_{33}$ constant, the piezoelectric $d_{33}$ constant in a high electric field, and the Curie point Tc were determined by the method and procedures in Example 1.

Table 3 illustrates the compositions of sample numbers 31 to 55. Table 4 illustrates the measurements and the firing temperature ranges ΔT for sample numbers 31 to 55.

TABLE 3

| Sample No. | Composition: $100\{(1-x)(K_{1-a-b}Na_aLi_b)_m(Nb_{1-c-d}Ta_cSb_d)O_3 - x(Na_{0.5}Bi_{0.5})_nTiO_3\} + In_2O_3$ | | | | | | |
|---|---|---|---|---|---|---|---|
| | x | a | b | c | d | m | n |
| 31 | 0.005 | 0.5 | 0 | 0 | 0 | 0.98 | 1 |
| 32 | 0.1 | 0.5 | 0 | 0 | 0 | 0.98 | 1 |
| 33 | 0.3 | 0.5 | 0 | 0 | 0 | 0.98 | 1 |
| 34 | 0.5 | 0.5 | 0 | 0 | 0 | 0.98 | 1 |
| 35* | 0.6 | 0.5 | 0 | 0 | 0 | 0.98 | 1 |
| 36 | 0.05 | 0 | 0 | 0 | 0 | 0.98 | 1 |
| 37 | 0.05 | 0.9 | 0 | 0 | 0 | 0.98 | 1 |
| 38* | 0.05 | 0.95 | 0 | 0 | 0 | 0.98 | 1 |
| 39 | 0.05 | 0.35 | 0.3 | 0 | 0 | 0.98 | 1 |
| 40* | 0.05 | 0.3 | 0.4 | 0 | 0 | 0.98 | 1 |
| 41 | 0.005 | 0.5 | 0 | 0.5 | 0 | 0.98 | 1 |
| 42* | 0.005 | 0.5 | 0 | 0.6 | 0 | 0.98 | 1 |
| 43 | 0.005 | 0.5 | 0 | 0 | 0.1 | 0.98 | 1 |
| 44* | 0.005 | 0.5 | 0 | 0 | 0.2 | 0.98 | 1 |
| 45* | 0.05 | 0.5 | 0 | 0 | 0 | 0.80 | 1 |
| 46 | 0.05 | 0.5 | 0 | 0 | 0 | 0.90 | 1 |
| 47 | 0.05 | 0.5 | 0 | 0 | 0 | 0.95 | 1 |
| 48 | 0.05 | 0.5 | 0 | 0 | 0 | 0.99 | 1 |
| 49 | 0.05 | 0.5 | 0 | 0 | 0 | 1.00 | 1 |
| 50 | 0.05 | 0.5 | 0 | 0 | 0 | 1.10 | 1 |
| 51* | 0.05 | 0.5 | 0 | 0 | 0 | 1.20 | 1 |
| 52* | 0.005 | 0.5 | 0 | 0 | 0 | 0.98 | 0.8 |
| 53 | 0.005 | 0.5 | 0 | 0 | 0 | 0.98 | 0.9 |
| 54 | 0.005 | 0.5 | 0 | 0 | 0 | 0.98 | 1.1 |
| 55* | 0.005 | 0.5 | 0 | 0 | 0 | 0.98 | 1.2 |

*means outside of the scope of the present invention.

TABLE 4

| Sample No. | Relative dielectric constant $\varepsilon r$ | Electromechanical coupling factor kp (%) | Piezoelectric $d_{33}$ constant (pC/N) | Piezoelectric $d_{33}$ constant in a high electric field (pC/N) | Curie point Tc (° C.) | Firing temperature range $\Delta T$ (° C.) |
|---|---|---|---|---|---|---|
| 31 | 456 | 43.2 | 162 | 267 | 380 | 25 |
| 32 | 589 | 44.2 | 182 | 296 | 350 | 30 |
| 33 | 1021 | 42.3 | 232 | 380 | 260 | 35 |
| 34 | 1523 | 32.3 | 212 | 345 | 150 | 35 |
| 35* | | | No piezoelectricity | | | |
| 36 | 976 | 31.2 | 171 | 284 | 340 | 20 |
| 37 | 1056 | 27.6 | 153 | 255 | 310 | 35 |
| 38* | | | No piezoelectricity | | | |
| 39 | 778 | 41.2 | 192 | 314 | 310 | 35 |
| 40* | | | No piezoelectricity | | | |
| 41 | 1643 | 33.4 | 225 | 368 | 130 | 35 |
| 42* | 2120 | 5.9 | 53 | 70 | 50 | 35 |
| 43 | 1420 | 38.4 | 243 | 390 | 180 | 35 |
| 44* | | | No piezoelectricity | | | |
| 45* | 678 | 10.8 | 53 | 60 | 310 | 25 |
| 46 | 756 | 42.1 | 204 | 330 | 310 | 35 |
| 47 | 762 | 46.3 | 221 | 364 | 310 | 35 |
| 48 | 682 | 49.3 | 223 | 366 | 310 | 35 |
| 49 | 583 | 28.4 | 109 | 153 | 310 | 35 |
| 50 | 563 | 27.8 | 105 | 150 | 310 | 35 |
| 51* | | — | | | | Poor sintering |
| 52* | 682 | 11.3 | 55 | 73 | 390 | 35 |
| 53 | 665 | 35.2 | 163 | 271 | 390 | 35 |
| 54 | 693 | 34.3 | 154 | 256 | 390 | 35 |
| 55* | 685 | 11.0 | 50 | 68 | 390 | 35 |

*means outside of the scope of the present invention.

In sample number 35, x was 0.6, i.e., was more than 0.5, and the molar amount of a third component $(Na_{0.5}Bi_{0.5})TiO_3$ was excessive. Thus, sample number 35 was poorly polarized and did not exhibit piezoelectricity.

By contrast, it was shown that when x was in the range of 0.005 to 0.5, in sample numbers 31 to 34, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics could be produced.

In sample number 38, a was 0.95, i.e., was more than 0.9. Thus, the molar ratio of Na was excessive and exceeded the solubility limit with K. Thus, sample number 38 exhibited no piezoelectricity.

By contrast, it was shown in sample numbers 36 and 37 that when a was in the range of 0 to 0.9, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics could be produced.

In sample number 40, b was 0.4, that is was more than 0.3. The molar ratio of Li was too large to form a ferroelectric phase. Thus, sample number 40 exhibited no piezoelectricity.

By contrast, it was shown in sample number 39 that when b was 0.3, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics could be produced.

In sample number 42 where c was 0.6, i.e., was more than 0.5, the piezoelectric $d_{33}$ constant was as low as 53 pC/N, the piezoelectric $d_{33}$ constant in a high electric field was as low as 70 pC/N, and thus the piezoelectric characteristics were poor.

By contrast, it was shown in sample number 41 that when c was 0.5, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics could be produced.

In sample number 44, d was 0.2 and thus was more than 0.1. Thus, Sb was excessive and the Curie point Tc was decreased. Sample number 44 did not exhibit piezoelectricity.

By contrast, it was shown in sample number 43 that when d was 0.1, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics could be produced.

In sample number 45, m was 0.80 and was thus less than 0.9, and the piezoelectric $d_{33}$ constant was as low as 53 pC/N, the piezoelectric $d_{33}$ constant in a high electric field was as low as 60 pC/N, and thus the piezoelectric characteristics were poor.

In sample number 51, m was 1.20 and was therefore more than 1.1. This caused poor sintering.

By contrast, m in sample numbers 46 to 50 was in the range of 0.9 to 1.1. Thus, piezoelectric ceramic electronic components having a piezoelectric $d_{33}$ constant of at least 100 pC/N and a piezoelectric $d_{33}$ constant in a high electric field of at least 200 pC/N and exhibiting excellent piezoelectric characteristics could be produced.

In particular, it was found that when m was in the range of 0.9 to 0.99, as in sample numbers 46 to 48, the piezoelectric $d_{33}$ constants were at least 200 pC/N, and the piezoelectric $d_{33}$ constants in a high electric field were at least 330 pC/N, and thus the piezoelectric characteristics could further be improved, as compared with sample numbers 49 and 50.

The reason for a slight degradation in the piezoelectric characteristics when m is more than 0.99 is probably that the amount of a component that is to constitute an A site, such as K, increases, and thus an element that is not involved in the synthesis of a solid solution reacts preferentially with a tetravalent element constituting a B site of a third component, such as Ti, to form a secondary phase that partly exhibits no piezoelectricity.

In sample number 52, it was found that when n was 0.8 and was thus less than 0.9, the piezoelectric $d_{33}$ constant was as low as 55 pC/N, the piezoelectric $d_{33}$ constant in a high electric field was as low as 73 pC/N, and thus the piezoelectric characteristics were poor.

In sample number 55, n was 1.2 and was therefore more than 1.1, and the piezoelectric $d_{33}$ constant was as low as 50 pC/N, the piezoelectric $d_{33}$ constant in a high electric field was as low as 68 pC/N, and thus the piezoelectric characteristics were poor.

By contrast, n was in the range of 0.9 to 1.1 in sample numbers 53 and 54. Thus, piezoelectric ceramic electronic components having a piezoelectric $d_{33}$ constant of at least 105 pC/N and a piezoelectric $d_{33}$ constant in a high electric field of at least 150 pC/N and exhibiting excellent piezoelectric characteristics could be produced.

These results showed that when the molar ratios of x, a, b, c, d, m and n in a main component are in the ranges of $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, a piezoelectric ceramic electronic component having a piezoelectric $d_{33}$ constant of at least 105 pC/N and a piezoelectric $d_{33}$ constant in a high electric field of at least 150 pC/N and exhibiting excellent piezoelectric characteristics can be produced.

Embodiment 3

A predetermined amount of Mn, Ni, Fe, Zn, Cu or Mg was added to the composition of sample number 1. Piezoelectric characteristics and the firing temperature range ΔT were determined.

More specifically, $K_2CO_3$, $Na_2CO_3$, $Nb_2O_5$, $Bi_2O_3$, $TiO_2$, $In_2O_3$, $MnCO_3$, NiO, $Fe_2O_3$, ZnO, CuO and $MgCO_3$ were prepared as raw materials for ceramics. These raw materials for ceramics were weighed to prepare compositions shown in Table 7. Test specimens of sample numbers 61 to 70 were produced by the same method and procedures as in Example 1. The firing temperature range ΔT was also determined as in Example 1.

The relative dielectric constant ∈r, the electromechanical coupling factor kp, the piezoelectric $d_{33}$ constant, the piezoelectric $d_{33}$ constant in a high electric field, and the Curie point Tc were determined in sample numbers 61 to 70 by the method and procedures in Example 1.

Table 5 illustrates the compositions of sample numbers 61 to 70, various measurements, and the firing temperature ranges ΔT, together with the measurements and the firing temperature range ΔT in sample number 1.

TABLE 5

| | | | | | | | |
|---|---|---|---|---|---|---|---|
| \multicolumn{8}{c}{$100\{0.95(K_{0.5}Na_{0.5})_{0.98}NbO_3 - 0.05(Na_{0.5}Bi_{0.5})TiO_3\} + In_2O_3 + \beta[Z^{q+}][O^{2-}]_{(q/2)}$} |
| Sample No. | Z | β (mol) | Relative dielectric constant ∈r | Electromechanical coupling factor kp (%) | Piezoelectric $d_{33}$ constant (pC/N) | Piezoelectric $d_{33}$ constant in a high electric field (pC/N) | Curie point Tc (° C.) | Firing temperature range ΔT (° C.) |
| 1 | — | 0 | 790 | 50.1 | 242 | 393 | 310 | 35 |
| 61 | Mn | 1 | 612 | 38.2 | 166 | 265 | 310 | 55 |
| 62 | Ni | 1 | 644 | 40.8 | 181 | 286 | 310 | 50 |
| 63 | Fe | 1 | 880 | 39.6 | 206 | 329 | 310 | 55 |
| 64 | Zn | 1 | 586 | 35.0 | 161 | 251 | 310 | 60 |
| 65 | Cu | 1 | 589 | 36.3 | 163 | 248 | 310 | 60 |
| 66 | Mg | 1 | 850 | 37.5 | 191 | 298 | 310 | 50 |
| 67 | Mn | 0.1 | 751 | 41.7 | 213 | 337 | 310 | 45 |
| 68 | Mn | 5 | 604 | 36.6 | 162 | 251 | 310 | 55 |
| 69 | Mn | 10 | 505 | 32.3 | 126 | 190 | 310 | 50 |
| 70* | Mn | 15 | — | — | — | — | — | Poor sintering |

*means outside of the scope of the present invention (Claim 4).

As is evident from Table 5, 1 to 10 mol of Mn, Ni, Fe, Zn, Cu, or Mg was added to 100 mol of a main component in sample numbers 61 to 69. Compared with sample number 1, while the piezoelectric $d_{33}$ constants and the piezoelectric $d_{33}$ constants in a high electric field were slightly decreased, the piezoelectric $d_{33}$ constants were at least 105 pC/N, the piezoelectric $d_{33}$ constants in a high electric field were at least 150 pC/N, and the firing temperature ranges ΔT for stable sintering were increased to 45 to 60 degrees C. Thus, it was found that the firing temperature ranges ΔT were wider by 10 to 25 degrees C. than sample number 1, and firing was possible in a wider temperature range ΔT.

In sample number 70, the molar amount of Mn was as large as 15 mol and was thus more than 10 mols per 100 mols of the main component. This caused poor sintering.

These results showed that the addition of as in sample numbers 46 to 48, 1 to 10 mol of Mn, Ni, Fe, Zn, Cu or Mg per 100 mols of a main component can further increase the firing temperature range ΔT.

The invention claimed is:

1. A piezoelectric ceramic composition comprising:
a main component having a general formula of $\{(1-x)(K_{1-a-b}Na_aLi_b)_m(Nb_{1-c-d}Ta_cSb_d)O_{3-x}(M1_{0.5}Bi_{0.5})_n M2O_3\}$, wherein M1 is at least one metallic element selected from the group consisting of K and Na, M2 is at least one metallic element selected from the group consisting of Ti, Zr and Sn, $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, and
at least one specific element selected from the group consisting of In, Sc, Y, Nd, Sm, Eu, Gd, Tb, Dy, Ho, Er, Yb and Lu in the form of an oxide in a total amount of about 1.5 to 10 mols per 100 mols of the main component, and further comprising at least one metallic element selected from the group consisting of Mn, Ni, Fe, Zn, Cu and Mg as an oxide in an amount of about 0.1 to 10 mols total per 100 mols of the main component.

2. The piezoelectric ceramic composition according to claim 1, wherein the specific element is about 1.5 to 10 mol total per 100 mols of the main component.

3. The piezoelectric ceramic composition according to claim 1, wherein $0.9 \leq m \leq 0.99$.

4. The piezoelectric ceramic composition according to claim 1, wherein M1 comprises Na, M2 comprises Ti, the specific element comprises In, and the metallic element comprises Mn.

5. A piezoelectric ceramic electronic component comprising an external electrode disposed on a surface of a piezoelectric ceramic element, wherein the piezoelectric ceramic element comprises a piezoelectric ceramic composition according to claim 1.

6. A piezoelectric ceramic electronic component comprising an external electrode disposed on a surface of a piezoelectric ceramic element, wherein the piezoelectric ceramic element comprises a piezoelectric ceramic composition according to claim 3.

7. The piezoelectric ceramic electronic component according to claim 6, wherein the piezoelectric ceramic element includes an internal electrode.

8. A piezoelectric ceramic composition comprising:
a main component having a general formula of $\{(1-x)(K_{1-a-b}Na_aLi_b)_m(Nb_{1-c-d}Ta_cSb_d)O_{3-x}(M1_{0.5}Bi_{0.5})_nM2O_3\}$, wherein M1 is at least one metallic element selected from the group consisting of K and Na, M2 is at least one metallic element selected from the group consisting of Ti, Zr and Sn, $0.005 \leq x \leq 0.5$, $0 \leq a \leq 0.9$, $0 \leq b \leq 0.3$, $0 \leq a+b \leq 0.9$, $0 \leq c \leq 0.5$, $0 \leq d \leq 0.1$, $0.9 \leq m \leq 1.1$, and $0.9 \leq n \leq 1.1$, and
at least one specific element selected from the group consisting of In, Sc, Y, Nd, Sm, Eu, Gd, Tb, Dy, Ho, Er, Yb and Lu in the form of an oxide in a total amount of about 0.1 to 10 mols per 100 mols of the main component, and
further comprising at least one metallic element selected from the group consisting of Mn, Ni, Fe, Zn, Cu and Mg as an oxide in an amount of about 0.1 to 10 mol total per 100 mols of the main component.

9. The piezoelectric ceramic composition according to claim 8, wherein M1 comprises Na, M2 comprises Ti and the specific element comprises In.

10. The piezoelectric ceramic composition according to claim 8, wherein the specific element is about 1.5 to 10 mol total per 100 mols of the main component.

11. A piezoelectric ceramic electronic component comprising an external electrode disposed on a surface of a piezoelectric ceramic element, wherein the piezoelectric ceramic element comprises a piezoelectric ceramic composition according to claim 8.

12. A piezoelectric ceramic electronic component comprising an external electrode disposed on a surface of a piezoelectric ceramic element, wherein the piezoelectric ceramic element comprises a piezoelectric ceramic composition according to claim 9.

13. A piezoelectric ceramic electronic component comprising an external electrode disposed on a surface of a piezoelectric ceramic element, wherein the piezoelectric ceramic element comprises a piezoelectric ceramic composition according to claim 4.

* * * * *